(12) United States Patent
Hook

(10) Patent No.: US 12,230,629 B2
(45) Date of Patent: Feb. 18, 2025

(54) SIZE-EFFICIENT MITIGATION OF LATCHUP AND LATCHUP PROPAGATION

(71) Applicant: INTERNATIONAL BUSINESS MACHINES CORPORATION, Armonk, NY (US)

(72) Inventor: Terence Hook, Jericho Center, VT (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 17/703,092

(22) Filed: Mar. 24, 2022

(65) Prior Publication Data

US 2023/0317722 A1 Oct. 5, 2023

(51) Int. Cl.
*H01L 27/085* (2006.01)
*H01L 27/02* (2006.01)
*H01L 27/092* (2006.01)

(52) U.S. Cl.
CPC ........ *H01L 27/085* (2013.01); *H01L 27/0207* (2013.01); *H01L 27/0921* (2013.01)

(58) Field of Classification Search
CPC ......... H01L 2027/1189; H01L 27/0921; H01L 27/085; H01L 27/0207; H01L 27/0925; H01L 27/0927; H01L 27/0928
See application file for complete search history.

(56) References Cited

U.S. PATENT DOCUMENTS

| | | | |
|---|---|---|---|
| 6,236,087 B1 | 5/2001 | Daly et al. | |
| 6,359,316 B1 | 3/2002 | Voss et al. | |
| 7,434,189 B2 | 10/2008 | Baumann et al. | |
| 7,877,713 B2 | 1/2011 | Kariat et al. | |
| 8,242,606 B2 | 8/2012 | Seo et al. | |
| 9,799,557 B2 | 10/2017 | Cheng et al. | |
| 10,727,326 B2 | 7/2020 | Lee et al. | |
| 2007/0120196 A1 | 5/2007 | Chen et al. | |
| 2020/0126901 A1 | 4/2020 | Chen et al. | |
| 2021/0066119 A1 | 3/2021 | Lin et al. | |
| 2021/0159313 A1* | 5/2021 | Block | H01L 21/823892 |

FOREIGN PATENT DOCUMENTS

| | | |
|---|---|---|
| CN | 1832180 A | 9/2006 |
| CN | 101271900 A | 3/2012 |
| WO | 2023180831 A1 | 9/2023 |

OTHER PUBLICATIONS

"A Smart Integrated Switch Cell for Well Bias Low Power Architecture," IP.Com, An IP.com Prior Art Database Technical Disclosure, IP.com No. IPCOM000217634D, IP.com Electronic Publication Date: May 10, 2012, 5 pages.

(Continued)

*Primary Examiner* — Thanhha S Pham
(74) *Attorney, Agent, or Firm* — IBM Patents+ Team

(57) ABSTRACT

A set of transistor elements includes a substrate of a first doping type and a first well and a second well, both of a second doping type and both formed on the substrate. The set of transistor elements also includes a first complementary transistor cell and a second complementary transistor cell. The set of transistor element also includes an anti-propagation region of the first doping type between the first well and the second well.

23 Claims, 5 Drawing Sheets

(56) References Cited

OTHER PUBLICATIONS

Huang et al., "ESD Protection Diode with Guard Ring Layout Optimized for Latch-up Immunity Enhancement in FinFET Technology," IEEE, 2019 41st Annual EOS/ESD Symposium (EOS/ESD), vol. EOS-41, 2019, 4 pages.
Chen et al., "Optimization Design on Active Guard Ring to Improve Latch-Up Immunity of CMOS Integrated Circuits," IEEE Transactions on Electron Devices, vol. 66, No. 4, Apr. 2019, 8 pages.
International Search Report and Written Opinion for International Application No. PCT/IB2023/051519, dated Mar. 24, 2022, 6 pages.

* cited by examiner

SIZE-EFFICIENT MITIGATION OF LATCHUP AND LATCHUP PROPAGATION

BACKGROUND

The present invention relates to semiconductor structures, and more specifically, to preventing and mitigating latchup in semiconductor structures.

Semiconductor structures, such as complementary metal-oxide semiconductor cells, are often manufactured in series within electronic devices, such as processor chips. A typical metal-oxide semiconductor device includes regions of silicon that are doped with electron donor or electron acceptor elements to make the silicon electrically active. These semiconductors typically include two regions that are doped with the same type of doping element surrounded by a region that is doped by the opposite doping element.

Semiconductor devices are often paired with a complementary semiconductor device (i.e., a device with regions that are doped with opposite elements) to form a complementary semiconductor cell. These cells may then be patterned in a series within an electronic device. The number of cells in a device may vary significantly based on the design of the device, but typically the cells within a series are patterned closely together in order to save overall device space (e.g., to reduce the overall size of a chip that contains the cells).

However, patterning semiconductor cells close together can cause conductors of a first cell to interact with the complementary conductors of a nearby cell, creating an unintended connection. One type of such connection is referred to as latchup. A latchup can occur when a low-impedance path is formed between a source of supply voltage (i.e., VDD) and source of ground between the doped regions of a semiconductor cell. Such a path may be formed when carriers of electric current (typically referred to as electrons and holes) migrate from the regions connected to supplies of those carries (e.g., leak) into and through neighboring regions through the wells and substrates into which those regions are embedded.

Once latchup occurs within a single cell, it can propagate to nearby cells, which can, over time, disrupt the functions of large numbers of cells and potentially cause irreversible damage due to overcurrent.

Some design elements exist to address latchup susceptibility and prevent propagation of latchup once it occurs. However, these solutions use up space in the pattern of semiconductors, and thus can disadvantageously increase the overall size of an electronic device. The benefits of these solutions are thus often weighed against the cost of increasing device size and other space considerations. For this reason, designs that are less susceptible to latchup and latchup propagation while being more space efficient would be beneficial.

SUMMARY

Some embodiments of the present disclosure can be illustrated as a set of transistor elements that comprises a substrate of the first doping type. The set of transistor elements also comprises a first well of a second doping type formed on the substrate. The set of transistor elements also comprises a second well of the second doping type formed on the substrate. The set of transistor elements also comprises a first plane that is parallel to and intersects the first and second wells. The set of transistor elements also comprises a second plane that is parallel to the first and second wells but does not intersect the first or second well. The set of transistor elements also comprises a first complementary transistor cell that is intersected by the first plane and a second complementary transistor cell that is intersected by the first plane. The set of transistor elements also comprises an anti-propagation region of the first doping type that is intersected by the first plane between the first well and the second well.

Some embodiments of the present disclosure can also be illustrated as the above set of transistor elements but further comprising a tap cell that is intersected by the first plane between the first complementary transistor cell and the anti-propagation region.

Some embodiments of the present disclosure can also be illustrated as the above set of transistor elements but further comprising a first minority collector region of the first doping type that is formed on the first well and that is intersected by the first plane between the first complementary transistor cell and the anti-propagation region.

Some embodiments of the present disclosure can also be illustrated as the above set of transistor elements but further comprising a minority collector of the second doping type formed in the anti-propagation region.

Some embodiments of the present disclosure can also be illustrated as the above set of transistor elements but further comprising a clamping contact that is located on the substrate and that is intersected by the second plane between the first well and the second well.

Some embodiments of the present disclosure can also be illustrated as the above set of transistor elements but further comprising a second anti-propagation region that is of the second doping type, that is formed on the substrate, and that is intersected by the second plane.

Some embodiments of the present disclosure can also be illustrated as a set of transistor elements that comprises a substrate of a first doping type. The set of transistor elements also comprises a well of a second doping type formed on the substrate. The set of transistor elements also comprises a first plane that is parallel to and intersects the well. The set of transistor elements also comprises a second plane that is parallel to the well but does not intersect the well. The set of transistor elements also comprises a first complementary transistor cell that is intersected by the first plane and a second complementary transistor cell that is intersected by the first plane. The set of transistor elements also comprises a minority collector region formed between the first complementary transistor cell and the second complementary transistor cell.

Some embodiments of the present disclosure can also be illustrated as the above set of transistor elements but further comprising a tap cell that is intersected by the first plane between the first complementary transistor cell and the minority collector region.

Some embodiments of the present disclosure can also be illustrated as the above set of transistor elements but further comprising a second tap cell that is intersected by the first plane between the second complementary transistor cell and the minority collector region.

Some embodiments of the present disclosure can also be illustrated as the above set of transistor elements but further comprising a second well of the second doping type formed on the substrate, an anti-propagation region of the first doping type. In these embodiments, the anti-propagation region is intersected by the first plane between the well and the second well, and the minority collector region may be of the second doping type and may be formed on the anti-propagation region.

Some embodiments of the present disclosure can also be illustrated as the above set of transistor elements with the specification that the minority collector region is formed on the substrate and is intersected by the second plane.

Some embodiments of the present disclosure can also be illustrated as the above set of transistor elements but further comprising an anti-propagation region that is of the second doping type, that is formed on the substrate, and that is intersected by the second plane.

DETAILED DESCRIPTION

Figure 1A:
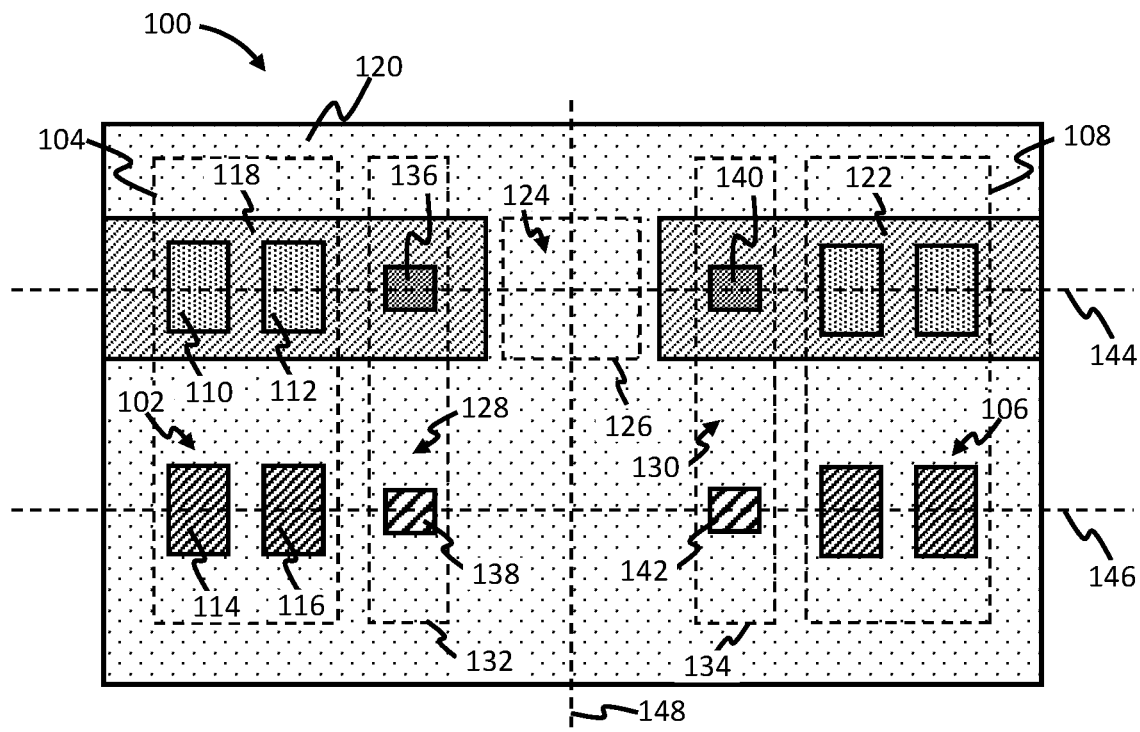
FIG. 1A illustrates a schematic view of an example embodiment of a set of transistor elements that includes an anti-propagation region and two tap cells.

Electronic devices often include semiconductor devices, such as complementary semiconductor cells, that are patterned together on a substrate to form logical circuits. These semiconductor devices are often constructed by silicon that is doped with electron acceptor elements (e.g., boron, aluminum, gallium) or electron donor elements (e.g., phosphorus, arsenic, antimony).

For example, a region of silicon that is doped with an electron acceptor (also referred to as a p-doped region) may be separated from a second such p-doped region by a region of silicon that may be undoped or doped with an electron donor (also referred to as an n-doped region). One of the p-doped regions (also referred to as the "source region") may be connected to a source of holes (e.g., VDD), and the second p-doped region (also referred to as the "drain region" or "output region") may be connected to an output. If the n-doped region is activated (e.g., by an adjacent metal gate), holes can flow from the source of voltage, through the first p-doped region, through the n-doped region, through the second p-doped region, and to the output.

In many circuitry designs, the above-described semiconductor device may be paired with a complementary semiconductor device in which the doping types of the regions are reversed (i.e., a complementary semiconductor composed of two n-doped regions separated by an undoped or p-doped region). In this complementary semiconductor device, the first n-doped region (also referred to as the "source region") is typically connected to a source of ground (e.g., VSS), and the second n-doped region (also referred to as the "drain region" or "output region") is typically connected to an output. These pairs of semiconductors are often referred to as a complementary semiconductor cell (also referred to herein as a "semiconductor cell"). Thus, in the typical semiconductor cell, charge carriers (either electrons or holes) are typically intended to flow from a voltage source (either a source of electrons or source of ground), through a set of doped silicon regions (either p-n-p regions (pFETs) or n-p-n regions (nFETs)) to an output.

However, in some instances unintended paths of current may be created throughout a semiconductor cell. This may often occur when charge carriers leak from their sources (e.g., VDD or ground) out of their respective regions (e.g., from VDD and out of a first p-doped region) and migrate throughout the surrounding regions (e.g., wells and substrates) of the cell. Due to this migration, these charge carriers can create low-impedance paths through which current can flow.

When such a path forms between the cell's source of holes and source of ground through the two source regions of the cell's complementary semiconductors, a latchup condition is said to occur. In a latchup condition, the path between VDD and ground through the two source regions can be of sufficiently low impedance that current continuously flows from VDD to ground. This is detrimental because the path between VDD and ground is not controlled. In other words, the connection cannot be easily switched off through the normal methods by which the cell is switched on and off. Further, the amount of current that flows through the path is also uncontrollable. This can not only lead to the cell not functioning, but also to current building up through the path that is sufficient to damage the cell and surrounding structures.

For these reasons, latchup in a single cell can be detrimental. A further detriment of latchup is that it is known to propagate to nearby cells, which can cause widespread issues and damage throughout a device.

Some designs can be incorporated into electronic devices to guard against latchup initiation and propagation. For example, some devices include tap cells placed periodically through a pattern of semiconductors. These tap cells add a set of contacts between complementary cells. For example, a typical tap cell may add a VDD contact to an n-doped region (e.g., an n-well or n-doped substrate) and a ground contact to a p-doped region (e.g., a p-well or p-doped substrate) between two standard semiconductor cells. This tap cell may function to clamp the potential of the two regions to which the contacts are attached, which may prevent source regions from becoming forward biased and injecting minority carriers into the well or substrate (e.g., electrons in p-doped semiconductor and holes in n-type semiconductor).

In theory, including one tap cell between each pair of semiconductor cells in a pattern of semiconductor cells would provide significant protection from latchup. However, because tap cells require space to place a contact between cells, including that number of tap cells would significantly increase the total size of some devices, making them completely impractical. Thus, some device designs place tap cells periodically throughout a pattern of cells. The frequency of tap cells in the pattern often depends on the design fabrication rules and the tradeoff between adding space to the overall design and the protection from latchup.

For this and other reasons, typical circuits are not completely immune to latchup initiation. In other words, even with reasonable incorporation of tap cells in a design, latchup can still occur in a semiconductor cell in a typical circuit. For this reason, typical electronic devices also include designs to mitigate the propagation of latchup throughout the device if latchup does occur. For example, some devices include guard rings of doped silicon throughout a design, often around input/output circuits. However, while guard rings can interrupt propagation, they typically consume a significant amount of design space. Thus, preventing propagation of latchup with typical anti-propagation designs can also significantly increase the overall size of an electronic device.

To address the above issues, some embodiments of the present disclosure provide protection from latchup initiation and propagation in a space-efficient manner. For example, some embodiments of the present disclosure reduce latchup propagation susceptibility by incorporating anti-propagation regions between the wells on which the diffusion regions of adjacent semiconductor cells are formed.

In some embodiments of the present disclosure, these anti-propagation regions may be bordered by a tap cell on one or both sides, which reduces the susceptibility to latchup of the semiconductor cells on both sides of the anti-propagation region.

Some embodiments of the present disclosure also include additional diffusion regions on the borders of these anti-propagation regions. These diffusion regions may be of a different doping type than the surface on which they are formed (e.g., an n-doped region on a p-doped well substrate or a p-doped region on an n-doped substrate or well), causing them to act as collector regions for minority carriers (e.g., holes in an n-doped semiconductor or electrons in a p-doped semiconductor) that have leaked out and migrated through a nearby semiconductor cell. In some instances, collecting these migrating minority carriers may prevent them from migrating to location in which they could assist in forming a low-impedance path between source regions of a semiconductor cell or neighboring semiconductor cells. In other words, collecting these minority carriers may not only prevent latchup initiation in a cell (or between cells), but also latchup propagation after initiation.

Some embodiments of the present disclosure also include additional source or ground contacts (similar to that in a tap cell) or additional diffusion regions that are placed in an anti-propagation region or otherwise between tap cells. In these embodiments, the anti-propagation region can, in addition to providing a physical impedance barrier to propagation, also take an electrically active role in preventing both latchup and propagation.

FIG. 1A illustrates a schematic view of an example embodiment of a set of transistor elements 100 that includes an anti-propagation region and two tap cells. Set of transistor elements 100 includes a first complementary semiconductor cell 102, surrounded, for the sake of clarity, by dashed line 104 and a second complementary semiconductor cell 106, surrounded by dashed line 108. Semiconductor cell 102 includes two transistors. The gate conductors have been omitted for clarity. The first transistor is of a first semiconductor type (e.g. a pFET) and includes source diffusion region 110 (also referred to herein as "region 110") and drain diffusion region 112 (also referred to herein as "region 112"). The second transistor is of a semiconductor type (e.g., an nFET) and includes source diffusion region 114 (also referred to herein as "region 114") and drain diffusion region 116 (also referred to herein as "region 116"). Regions 110 and 112 are, as illustrated, formed on well 118, which is embedded within a substrate 120. Regions 114 and 116 are, as illustrated, formed on substrate 120.

Substrate 120 and regions 110 and 112 are all illustrated with a fill pattern of dots, indicating that they are doped with the same dopant (e.g., electron acceptor elements or electron donor elements). In other words, substrate 120 and regions 110 and 112 are of the same doping type (e.g., p-doped or n-doped). Similarly, well 118 and regions 114 and 116 are all illustrated with a fill pattern of diagonal lines, indicating that they are doped with the same dopant, but a different dopant as substrate 120 and regions 110 and 112. In other words, well 118 and regions 114 and 116 have the opposite doping type of substrate 120 and regions 110 and 112. Thus, substrate 120 and regions 110 and 112 may be p-doped, in which case well 118 and regions 114 and 116 would be n-doped.

Similar to semiconductor cell 104, semiconductor cell 106 contains a first semiconductor formed on well 122 and a second semiconductor formed on substrate 120. Well 122 is also illustrated with a fill pattern of diagonal lines, indicating that it, like well 118, is of a doping type that is opposite of substrate 120.

Of note, set of transistor elements 100 contains two wells 118 and 122 because the two wells are separated by anti-propagation region 124, which is bordered, for the sake of clarity, with dashed line 126. Antipropagation region 124 effectively provides a high impedance to any path that would otherwise be formed between the diffusion regions of semiconductor cells 102 and 106 that are formed upon wells 118 and 122. In other words, for example, even if a forward-bias condition as a precursor to latchup were to occur between, for example, source diffusion region 110 and well region 118, anti-propagation region 124 may significantly reduce the likelihood of that forward bias condition to propagate to semiconductor cell 106 through wells 118 and 122.

Set of transistor elements 100 also contains two tap cells 128 and 130, bordered, for the sake of clarity, with dashed lines 132 and 134 respectively. Tap cell 128 contains contact 136 that is formed upon well 118 and contact 138 that is formed on substrate 120. Contact 136 is illustrated with a fill pattern of dots, indicating that it is connected to the same voltage source as source diffusion region 110. For example, if source diffusion region 110 were connected to VDD, contact 136 would also be connected to VDD. This may clamp the potential of the well to be same as diffusion region 110, preventing forward bias, lowering the potential for latchup in semiconductor cell 102.

Contact 138 of tap cell 128 is illustrated with a fill pattern of diagonal lines, indicating that it is connected to the same voltage source as diffusion region 114. Thus, contact 138 may clamp the substrate potential to be the same as the potential of diffusion region 114, preventing forward bias. In other words, contact 138 may act to lower the susceptibility of semiconductor cell 102 to latchup in the same way that contact 136 does.

Of note, tap cell 130 also contains contacts 140 and 142. Contact 140 may function similarly to contact 136, and contact 142 may function similarly to 138.

It is also of note that including two separate tap cells between a single pair of complementary semiconductor cells may, in some use cases, take up more space than a single tap cell between a single pair of complementary semiconductor cells. However, depending on the ground rules of the use case, it may be difficult to place a pair of semiconductor cells (e.g., semiconductor cells 102 and 106) very close to the edge of wells 118 and 122 near anti-propagation region 124. Thus, in some use cases it may be possible to fit the contacts necessary for tap cells in the space on the wells that is required between the semiconductor cells and the edges of the wells. For this reason, in some embodiments adding tap cells 128 and 130 may not actually increase the size required for set of transistor elements 100, but may simply utilize space that is required due to ground rules. Thus, the latchup-prevention benefits of tap cells 128 and 130 may come at no additional cost to design space.

However, in some use cases that may not be true, and thus adding both tap cells 128 and 130 at the edges of anti-propagation region 124 may actually increase the space required for set of transistor elements 100. In these use cases, it may be beneficial to save space by including only one, or neither, of tap cells 128 and 130. In these use cases, the benefits that each tap cells marginally provides to latchup prevention for the surrounding semiconductor cells may need to be compared to the space-saving preferences for the design.

Of note, FIG. 1A also includes 3 planes for the sake of understanding. Plane 144 extends into and out of the paper on which FIG. 1A is printed and is parallel to and intersects wells 118 and wells 122. Plane 146 extends into and out of the paper on which FIG. 1A is printed and is parallel to plane 144 and wells 118 and 122, but does not intersect wells 118 and 112. Midplane 148 extends into and out of the paper on which FIG. 1A is printed and is perpendicular to planes 144 and 146 and wells 118 and 122. Midplane 148 intersects anti-propagation region 124.

Figure 1B:
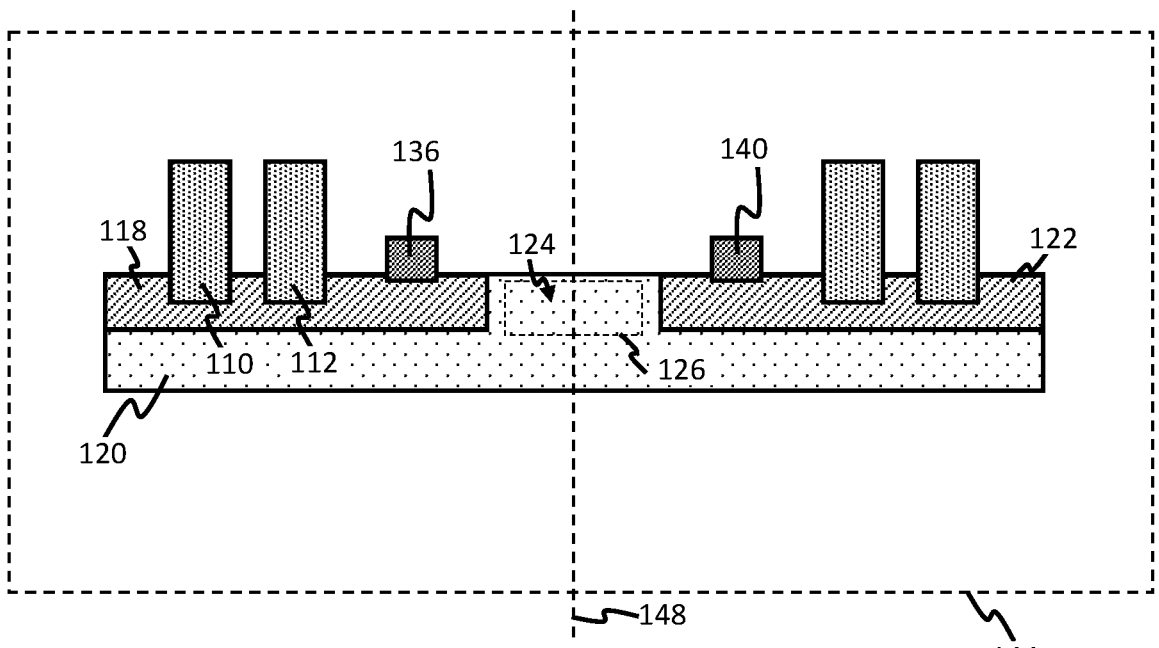
FIG. 1B illustrates, for the sake of clarity, a cross-sectional of set of the transistor elements of FIG. 1A.

FIG. 1B illustrates, for the sake of clarity, a cross-sectional of set of transistor elements 100 that is intersected by plane 144. As such, plane 144 is represented by a dashed outline in FIG. 1B.

As can be seen in FIG. 1B, wells 118 and 122 are separated by anti-propagation region 124, which is composed of substrate 120. Thus, the portion of substrate 120, being of a doping type that is opposite of the doping type of wells 118 and 122, creates a high-impedance path through which charge carriers would need to travel to propagate between wells 118 and 122. In other words, a latchup event in a cell in one well (e.g., semiconductor cell 102) may be very unlikely to propagate to the other well.

As noted above, the inclusion of tap cells 128 and 130, as well as anti-propagation region 124, may result in set of transistor elements 100 taking up more space in a design. However, in some use cases the benefits of reducing susceptibility to latchup and latchup propagation may overcome the detriments of the increased space requirement.

Similarly, in some use cases the benefits of reducing latchup may be sufficient to justify inclusion of other transistor elements, even if space requirements are further increased due to that inclusion.

Figure 2A:
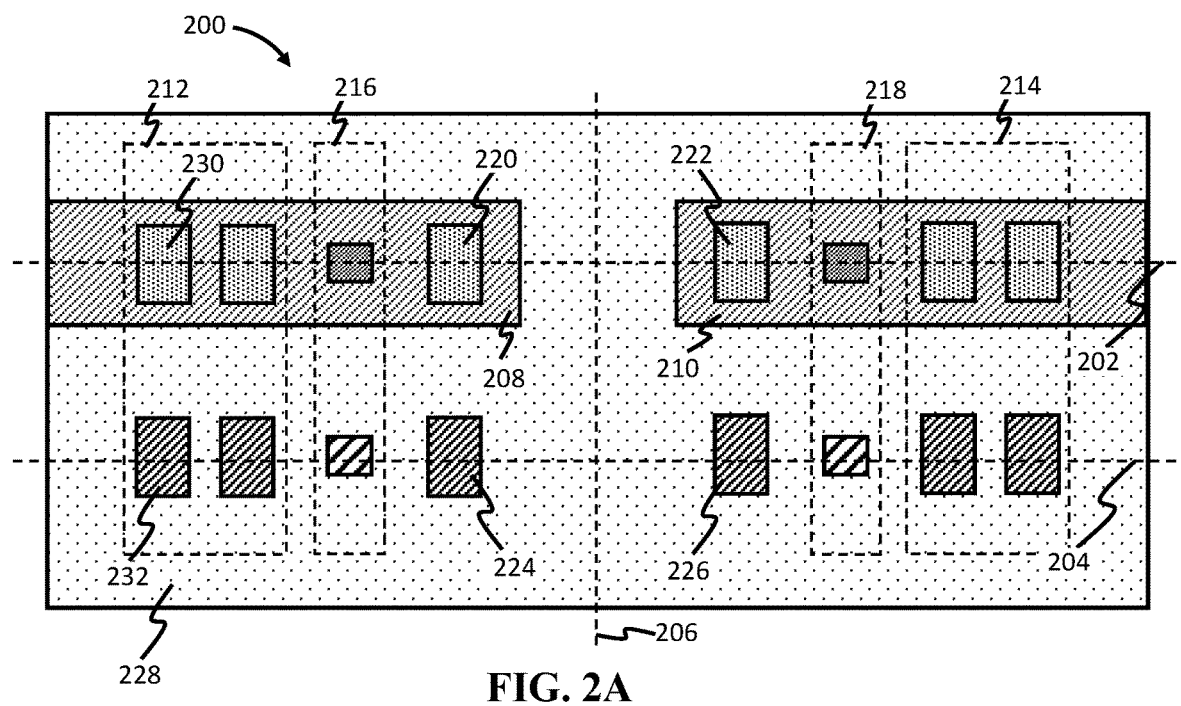
FIG. 2A illustrates a schematic view of an example embodiment of a set of transistor elements that includes two tap cells and a set of minority collectors.

FIG. 2A, for example, illustrates a schematic view of an example embodiment of a set of transistor elements 200 that includes two tap cells and a set of minority collectors. Similar to set of transistor elements 100, set of transistor elements 200 includes plane 202, plane 204, and midplane 206. Set of transistor elements 200 also includes two complementary semiconductor cells, indicated by dashed outlines 212 and 214, and two tap cells, indicated by dashed outlines 216 and 218.

Unlike set of transistor elements 100, set of transistor elements 200 includes 4 minority collector regions 220, 222, 224, and 226. Minority collector regions 220 and 222 are intersected by plane 202 and are formed on wells 208 and 210 respectively. Minority collector regions 224 and 226, on the other hand, are intersected by plane 204 and are formed on substrate 228.

Minority collector regions 220 and 222 are of the same doping type as the diffusion regions of semiconductor cells 212 and 214 that are also formed on wells 208 and 210. Similarly, minority collector regions 224 and 226 are of the same doping type as the diffusion regions of semiconductor cells 212 and 214 that are also formed on substrate 228. However, minority collectors 220-226 are connected to the opposite source of voltage to which those corresponding diffusion regions are connected.

For example, minority collector region 220 is of the same doping type (e.g., p-doped) as source diffusion region 230 and opposite as source diffusion region 230. However, minority collector region 220 is connected to the opposite source of voltage to which source diffusion region 230 is connected (i.e., the same source of voltage to which source diffusion region 232 is connected). For example, if source diffusion region is connected to VDD, minority collector region 220 would be connected to ground. As minority collector region 220 is biased at ground, this provides a harmless path to collect minority carriers that may have been injected from regions 232. Analogously, minority collection region 224 can collect carriers that may have been injected from source diffusion region 230 without becoming forward biased. Thus, minority collector regions 220-226 may reduce the susceptibility of set of transistor elements 200 to latchup.

Figure 2B:
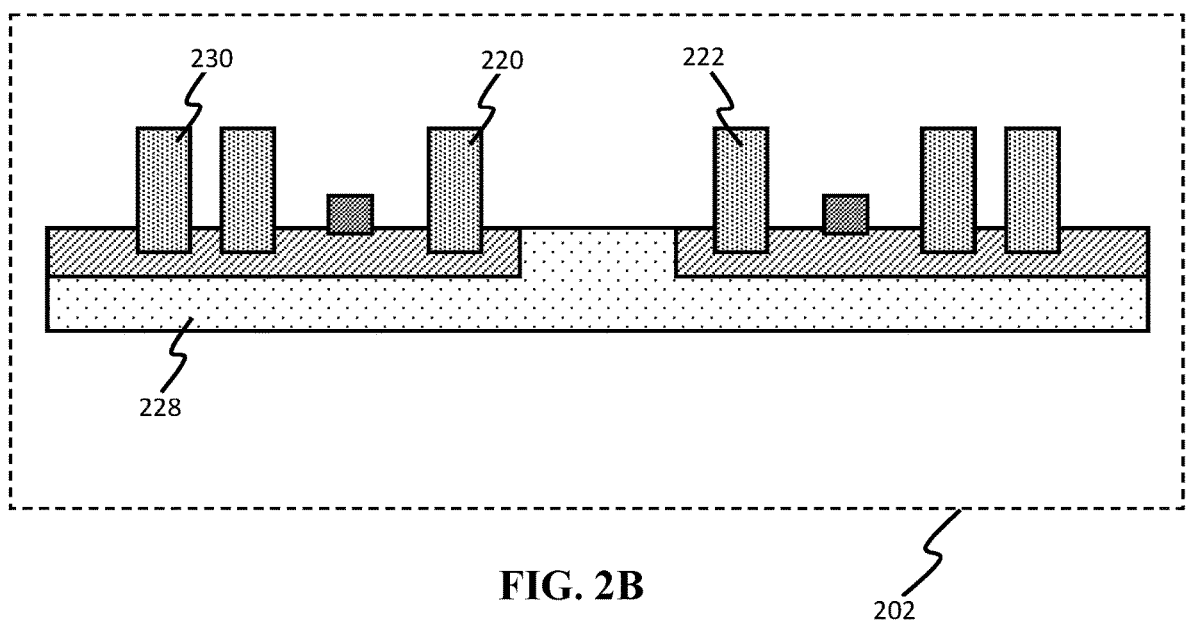
FIG. 2B illustrates, for the sake of clarity, a cross-sectional of the set of transistor elements of FIG. 2A.

FIG. 2B illustrates, for the sake of clarity, a cross-sectional of set of transistor elements 200 that is intersected by plane 202. As such, plane 202 is represented by a dashed outline in FIG. 2B.

As can be seen in FIG. 2B, minority collector regions 220 and 222 may be similar to the diffusion regions of the semiconductor cells in set of transistor elements 200 in both doping and form factor. However, as noted, minority collector regions 220 and 222 are connected to an opposite source of voltage as those diffusion regions, enabling them to attract minority carriers without causing forward bias.

Figure 5:
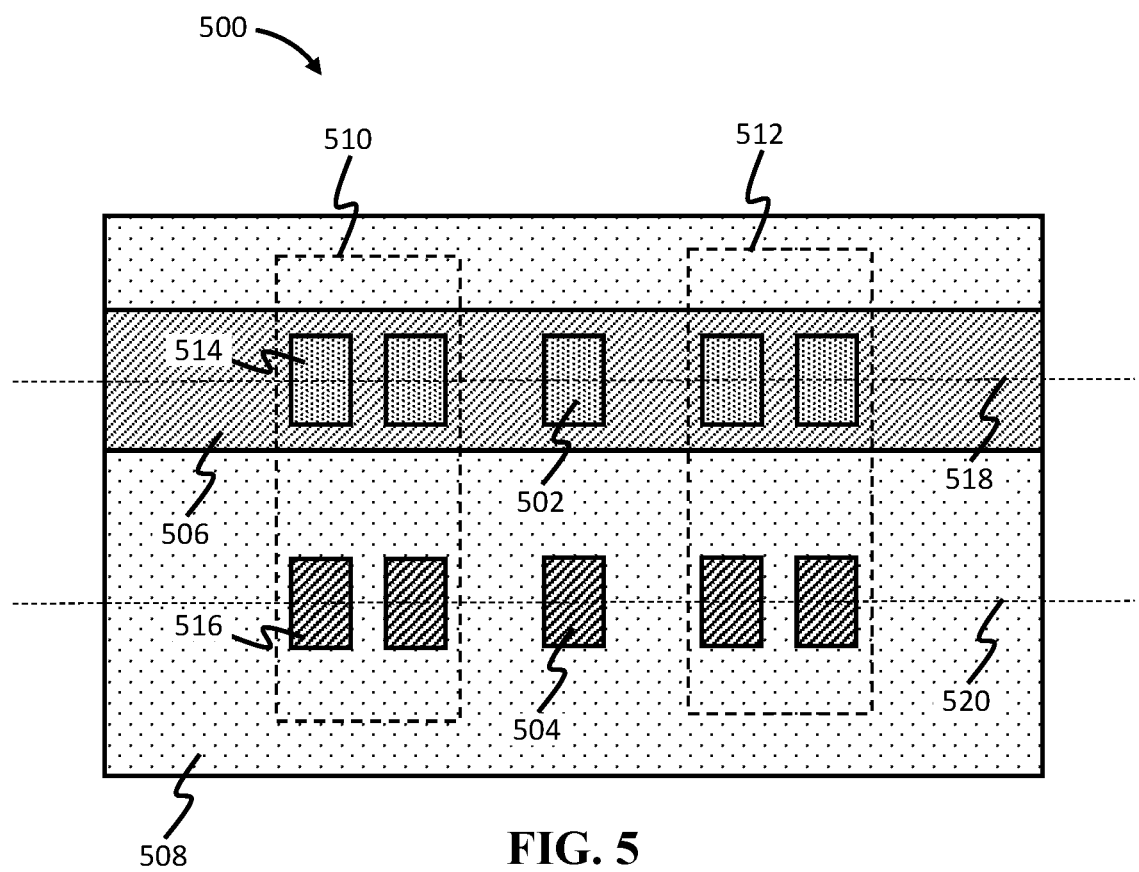
FIG. 5 illustrates a set of transistor elements in which multiple minority collector regions have been incorporated without an anti-propagation region.

Of note, set of transistor elements 200 are illustrated in FIGS. 2A and 2B as containing an anti-propagation region between wells 208 and 210. However, in some use cases the spacing considerations for set of transistor elements 200 may not justify including an anti-propagation region. In other words, the increased size of set of transistor elements 200 that is caused by including an anti-propagation region may outweigh the benefits of reducing latchup propagation between semiconductor cells 212 and 214. In these use cases, the embodiment illustrated in FIGS. 2A and 2B may be adjusted to account for these spacing considerations. An example of such an embodiment is illustrated in FIG. 5 below.

In some use cases, as discussed previously, the benefits of an anti-propagation region may outweigh the space considerations of including that anti-propagation region. Further, depending upon the ground rules for these use cases, an anti-propagation region may be large enough by necessity to allow further structures to be formed upon it.

Figure 3:
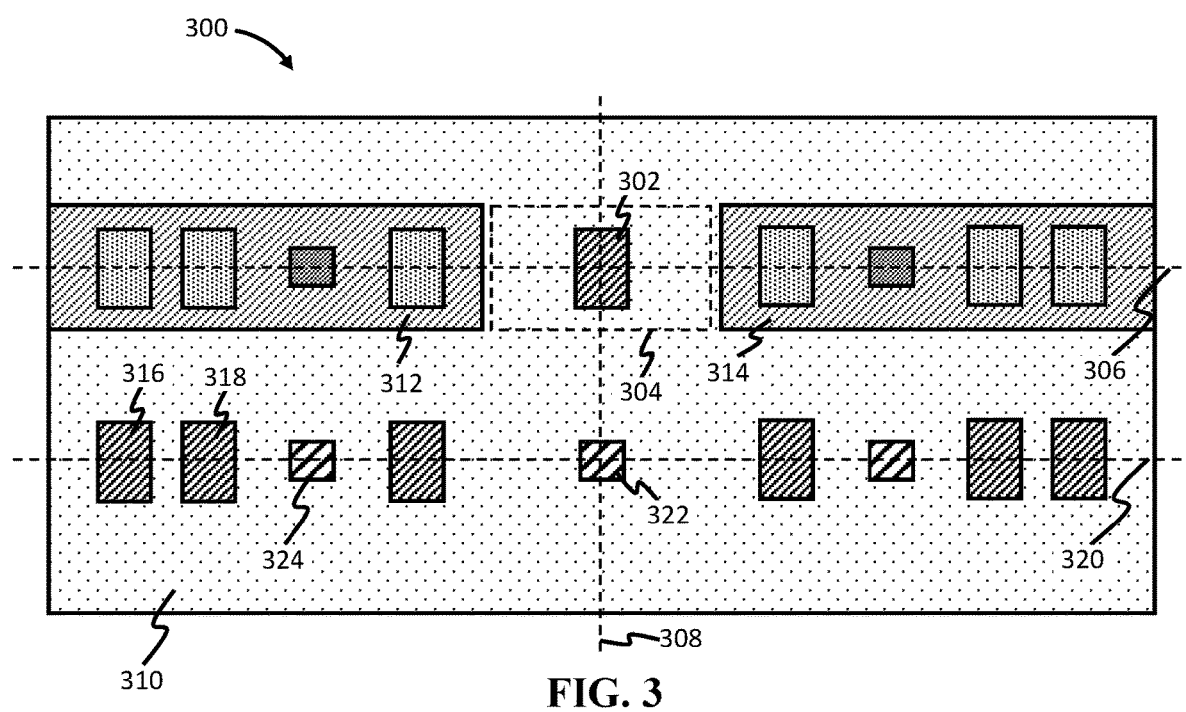
FIG. 3 illustrates a schematic view of an example embodiment of a set of transistor elements that includes a minority collector region formed within an anti-propagation region.

FIG. 3 for example, illustrates a schematic view of an example embodiment of a set of transistor elements 300 that includes a minority collector region formed within an anti-propagation region. Specifically, minority collector region 302 is formed within the anti-propagation region that is represented by dashed outline 304. Minority collector region is illustrated as intersected by plane 306 and by midplane 308.

Similar to minority collector regions 224 and 226 of FIG. 2A, minority collector region 302 may function to collect minority carriers that leak into substrate 310. This may prevent those minority carriers from leaking into wells 312 or 314, preventing a low-impedance path from being formed between the source diffusion regions of complementary semiconductors in a semiconductor cell. Specifically, minority collector region 302 is of the same doping type as, for example, diffusion regions 316 and 318. However, minority collector region 302 is connected to the opposite source of voltage. Thus, for example, if diffusion regions 316 and 318 are of an n-doping type and are connected to a ground source (e.g., VSS), minority collector region would be of an n-doping type but would be connected to a hole source (e.g., VDD).

As illustrated in FIG. 3, the space required for including an anti-propagation region in plane 306 also may result in extra space being available in plane 320. Thus, set of transistor elements 300 also includes a clamping contact 322 formed on substrate 310. Clamping contact 322 is intersected by plane 320 and, similar to minority collector region 302, midplane 308. As such, clamping contact 322 may also be described as intersected by plane 320 between wells 312 and 314.

Clamping contact 322 may take the form of a metal contact that is connected to the same type of voltage source as tap contact 324. In other words, if diffusion region 316 is connected to ground), clamping contact 322 and tap contact 324 would also be connected to ground.

As such, clamping contact 322 may serve a similar function to a tap cell. Specifically, clamping contact 322 may serve as an ohmic contact, clamping the potential of substrate 310. Clamping contact 322 may, in other words, prevent substrate 310 from becoming forward biased relative to diffusion regions 316 and 318 In this way, clamping contact 322 may further reduce the susceptibility to latchup.

Of note, set of transistor elements 300 includes only a single minority collector region and a single clamping contact formed between wells 312 and 314. However, in some use cases the spacing considerations may actually permit multiple elements, for example, to be formed on an anti-propagation region between wells. For example, in some embodiments groundrules may require a sufficient distance be formed between wells 312 and 314 that a second minority collector region (or a clamping contact) may be formed in the anti-propagation region and intersected by plane 306.

It is also of note that in some embodiments of the present disclosure, a set of transistor elements may resemble set of transistor elements 300 but may include different transistor elements at midplane 308. For example, a clamping contact may be intersected by plane 306 and midplane 308, whereas a minority collector region like minority collector region 302 may be intersected by plane 320 and midplane 308.

Further, in some embodiments, ground rules, spacing considerations, and preference for prevention of latchup propagation may cause the inclusion of a second anti-propagation region within a set of transistor elements to be beneficial.

Figure 4A:
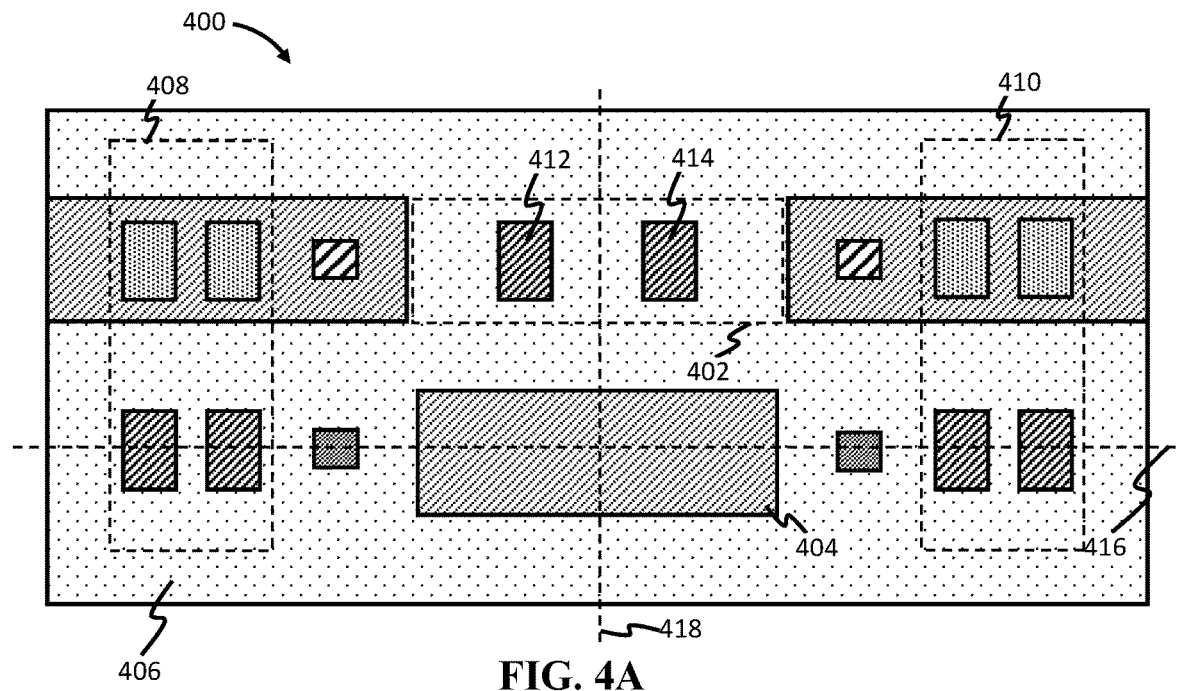
FIG. 4A illustrates a schematic view of an example embodiment of a set of transistor elements that includes two anti-propagation regions.

FIG. 4A for example, illustrates a schematic view of an example embodiment of a set of transistor elements 400 that includes two anti-propagation regions. The first anti-propagation region is indicated by outline 402, whereas the second anti-propagation region, anti-propagation region 404, is illustrated as a well formed within substrate 406. Anti-propagation region 404 is of a different doping type as substrate 406, and may thus serve as a high-impedance path between the semiconductor cells indicated by outlines 408 and 410. This high-impedance path may serve to reduce the likelihood of a latchup condition from one semiconductor cell propagating to the other semiconductor cell. Further, clamping contacts or minority collectors may also be added to anti-propagation region 404, further reducing the susceptibility to latchup.

Set of transistor elements 400 also includes minority collectors 412 and 414 formed within the anti-propagation region indicated by outline 402. This may be beneficial in use cases in which anti-propagation region 404 requires increasing the space between semiconductor cells to such an extent that two components may be placed in the anti-propagation region indicated by outline 402. In other words, in use cases in which groundrules require that that space is available, placing multiple minority collectors (or clamping contacts) in the space may be beneficial.

Figure 4B:
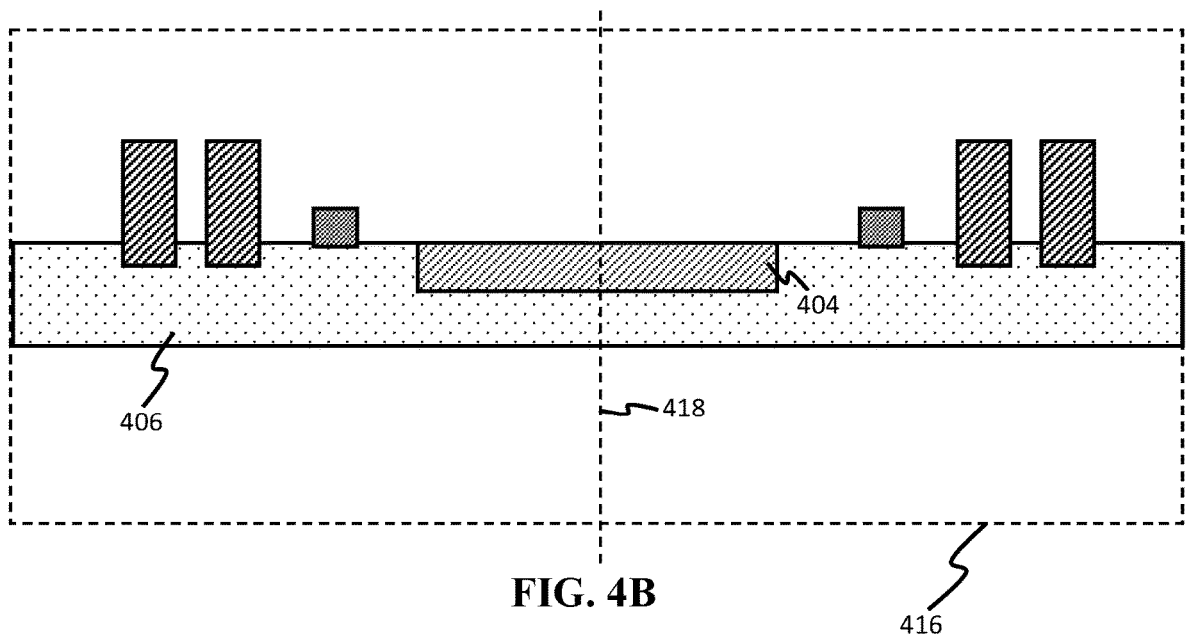
FIG. 4B illustrates, for the sake of clarity, a cross-sectional view of the set of transistor elements of FIG. 4A.

Anti-propagation region 404 is intersected by plane 416 and midplane 418. FIG. 4B illustrates, for the sake of clarity, cross-sectional of set of transistor elements 400 as intersected by plane 416. Plane 416 is represented by a dashed outline in FIG. 4B.

FIG. 4B illustrates anti-propagation region 404 as a well intersected by midplane 418. While anti-propagation region 404 may not offer a complete physical barrier between semiconductor cells 408 and 410, anti-propagation region 404 would still increase the impedance between these cells 408 and 410. Specifically, requiring charge carriers (e.g., minority or majority carriers) to navigate around anti-propagation region 404 may increase the impedance of such a path to a significant degree that susceptibility to latchup propagation is reduced. For at least this reason, in some use cases the reduction in latchup propagation may outweigh the potential detriments of increasing the size of set of transistor elements 400 to make room for anti-propagation region 404.

FIGS. 1A-4B each illustrate an embodiment in which at least one anti-propagation region is formed. However, as noted above, in use cases the benefits of including an anti-propagation region may be overcome by the extra space that is required to include an anti-propagation region. For example, in some embodiments the space required by an anti-propagation region may result in anti-propagation regions being used only seldomly in a pattern. In some embodiments of the present disclosure, therefore, some other features discussed above may be utilized more frequently in a pattern of transistors than anti-propagation regions.

FIG. 5, for example, illustrates a set of transistor elements 500 in which multiple minority collector regions 502 and 504 have been incorporated without an anti-propagation region. Set of transistor elements 500 also contains a well 506 and substrate 508, neither of which contain an anti-propagation region in the space illustrated in FIG. 5. Set of transistor elements 500 also contains a first complementary transistor cell that is shown by outline 510 and a second complementary transistor cell that is shown by outline 512. The first complementary transistor cell contains source diffusion regions 514 and 516.

FIG. 5 also illustrates plane 518 and plane 520. Plane 518 is parallel to and intersects well 506. Plane 518 also intersects the first complementary transistor cell (for example, plane 518 intersects source diffusion region 514) and the second complementary transistor cell. Finally, plane 518 also intersects minority collector region 502 between the first and second complementary transistor cells. Plane 520, on the other hand, is parallel to well 506 but does not intersect well 506. Rather, Plane 520 intersects the first complementary transistor cell (for example, source diffusion region 516) and the second complementary transistor cell. Finally, plane 520 intersects minority collector region 504 between the first and second complementary transistor cells.

Minority collector cells 502 and 504 may provide sufficient local latchup protection for some use cases. Further, the space savings of not forming an anti-propagation region within set of transistor elements 500 may outweigh the lack of propagation protection that such anti-propagation region would afford. However, in some use cases, further local latchup protection may be desired. In these use cases, further protection mechanisms could be added to set of transistor elements 500, such as tap cells between the first and second transistor cells (for example, on either side of minority collector regions 502 and 504).

Several mentions of spacing considerations and rules have been made throughout the present disclosure. Because embodiments of the present disclosure presents sets of transistor elements of many permutations, various spacing rules may also be utilized in some embodiments. These spacing rules may be determined partially by the specifics of the use case. Some spacing rules, for example, may provide the maximum preferred distance between a transistor cell (or, for example, a diffusion region in a transistor cell) and an anti-latchup element (e.g., a tap cell).

For example, embodiments of the present disclosure disclose at least four spacing categories: (1) distance between a well transistor cell (i.e., a transistor cell that is formed on a well) and a minority collector region on that same well, (2) distance between a substrate transistor cell and a minority collector region on the substrate, (3) distance between a well transistor cell and a clamping contact on that same well, and (4) distance between a substrate transistor cell and a clamping contact on the substrate. In some embodiments, a rule may specify the same maximum distance for all four spacing categories. However, in some use cases, a rule may specify a same maximum distance for categories 1 and 3 and a same maximum distance for categories 2 and 4, but different maximum distance for categories 1 and 2 and for 2 and 3. Similarly, in some embodiments, a rule may specify a different maximum distance for all four categories.

For example, in some embodiments a rule may set a first maximum distance between source diffusion region 514 and the nearest clamping contact on well 506, a second maximum distance between source diffusion region 514 and the nearest minority collector region on well 506 (i.e., minority collector region 502), a third maximum distance between source diffusion region 516 and the nearest clamping contact on substrate 508, and a fourth maximum distance between source diffusion region 516 and the nearest minority collector region on substrate 508 (i.e., minority collector region 504). In some of these embodiments, each of those four maximum distances may be different.

Further, in some embodiments similar rules may set maximum distances between transistors and the nearest anti-propagation region. Continuing the previous example, the rule may also set a fifth maximum distance between source diffusion region 514 and the nearest anti-propagation region that interrupts well 506 (for example, an anti-propagation region that is intersected by plane 518) and a sixth maximum distance between source diffusion region 516 that interrupts substrate 508 and is intersected by plane 520. In these embodiments, the fifth and sixth differences may also be different.

Of note, FIGS. 1A-5 represent simplified diagrams of sets of transistor elements. The embodiments of the present disclosure are presented in this simplified manner for the sake of understanding. As such, the figures of this disclosure are not intended to be interpreted as literal depictions of any embodiment of the present disclosure. For example, diffusion regions and minority collector regions are presented in an abstracted fin form factor (thus, source diffusion region 110 may take the form of a FinFET), but other transistor form factors (e.g., planar regions) are contemplated as long as those form factors do not conflict with the spirit and scope of the embodiments of this disclosure. Similarly, what are referred to herein as diffusion regions may in fact, in some embodiments, be epitaxial doped regions.

Further, the proportions of sizes of some elements of some figures may be greatly skewed for the purpose of adequately explaining the embodiments. Similarly, some necessary elements for device functionality have been omitted from the figures to avoid needlessly cluttering the figures. For this reason, electron-source connections and ground connections have been omitted from the drawings, as have gates (e.g., metal gates) that may be necessary to cause semiconductor cells to switch states. Further, oxide insulation layers between some elements (e.g., diffusion regions of different doping types) have been omitted.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A set of transistor elements comprising:
   a substrate of a first doping type;
   a first well of a second doping type formed on the substrate;
   a second well of the second doping type formed on the substrate;
   a first plane that is parallel to a first side of the first well and a second side of the second well and intersects the first and second wells;
   a first complementary transistor cell that is intersected by the first plane;
   a second complementary transistor cell that is intersected by the first plane; and
   an anti-propagation region of the first doping type that is intersected by the first plane between the first well and the second well.

2. The set of transistor elements of claim 1, further comprising:
   a first tap cell that is intersected by the first plane between the first complementary transistor cell and the anti-propagation region.

3. The set of transistor elements of claim 2, further comprising:
   a second tap cell that is intersected by the first plane between the second complementary transistor cell and the anti-propagation region.

4. The set of transistor elements of claim 2, further comprising:
   a first minority collector region of the first doping type that is formed on the first well and that is intersected by the first plane between the first tap cell and the anti-propagation region.

5. The set of transistor elements of claim 3, further comprising:
   a second plane that is parallel to the first and second sides but does not intersect the first or second well;

a first minority collector region of the first doping type that is formed on the first well and that is intersected by the first plane between the first tap cell and the anti-propagation region;

a second minority collector region of the first doping type that is formed on the second well and that is intersected by the second plane between the second tap cell and the anti-propagation region.

6. The set of transistor elements of claim 1, further comprising:

a first minority collector region of the first doping type that is formed on the first well and that is intersected by the first plane between the first complementary transistor cell and the anti-propagation region.

7. The set of transistor elements of claim 1, further comprising a minority collector of the second doping type formed in the anti-propagation region.

8. The set of transistor elements of claim 1, further comprising:

a second plane that is parallel to the first and second sides but does not intersect the first or second well; and a clamping contact that is located on the substrate and that is intersected by the second plane between the first well and the second well.

9. The set of transistor elements of claim 1, further comprising:

a second plane that is parallel to the first and second sides but does not intersect the first or second well; and a second anti-propagation region that is of the second doping type, that is formed on the substrate, and that is intersected by the second plane.

10. The set of transistor elements of claim 1, further comprising:

a second plane that is parallel to the first and second sides but does not intersect the first or second well; and a minority collector that is of the second doping type, that is formed on the substrate, and that is intersected by the second plane.

11. A set of transistor elements comprising:

a substrate of a first doping type;

a first well of a second doping type formed on the substrate;

a first plane that is parallel to a first side of the first well and intersects the first well;

a first complementary transistor cell that is intersected by the first plane;

a second complementary transistor cell that is intersected by the first plane; and a minority collector region formed between the first complementary transistor cell and the second complementary transistor cell.

12. The set of transistor elements of claim 11, further comprising:

a second well of the second doping type formed on the substrate;

an anti-propagation region of the first doping type, wherein the anti-propagation region is intersected by the first plane between the first well and the second well.

13. The set of transistor elements of claim 12, wherein the minority collector region is formed between the first complementary transistor cell and the anti-propagation region.

14. The set of transistor elements of claim 11, further comprising:

a first tap cell that is intersected by the first plane between the first complementary transistor cell and the minority collector region.

15. The set of transistor elements of claim 14, further comprising:

a second tap cell that is intersected by the first plane between the second complementary transistor cell and the minority collector region.

16. The set of transistor elements of claim 15, further comprising:

a second minority collector region that is formed between the first tap cell and the second tap cell.

17. The set of transistor elements of claim 12, wherein the minority collector region is of the second doping type and is formed on the anti-propagation region.

18. The set of transistor elements of claim 12, further comprising:

a clamping contact that is located on the anti-propagation region.

19. The set of transistor elements of claim 12, further comprising:

a second plane that is parallel to the first side but does not intersect the first well; and a clamping contact that is located on the substrate and that is intersected by the second plane between the first well and the second well.

20. The set of transistor elements of claim 12, further comprising:

a second plane that is parallel to the first side but does not intersect the first well; and a second anti-propagation region that is of the second doping type, that is formed on the substrate, and that is intersected by the second plane.

21. The set of transistor elements of claim 11, further comprising a second plane that is parallel to the first side but does not intersect the first well, wherein the minority collector region is formed on the substrate and is intersected by the second plane.

22. The set of transistor elements of claim 11, further comprising:

a second plane that is parallel to the first side but does not intersect the first well; and an anti-propagation region that is of the second doping type, that is formed on the substrate, and that is intersected by the second plane.

23. A set of transistor elements comprising:

a substrate of a first doping type;

a first well of a second doping type formed on the substrate;

a first plane that is parallel to a first side of the first well and intersects the first well;

a first complementary transistor cell that is intersected by the first plane;

a second complementary transistor cell that is intersected by the first plane; and an anti-propagation region of the first doping type that is intersected by the first plane between the first complementary transistor cell and the second complementary transistor cell.

* * * * *